(12) United States Patent
Chao et al.

(10) Patent No.: US 11,309,887 B2
(45) Date of Patent: *Apr. 19, 2022

(54) CONVERSION CIRCUIT

(71) Applicant: DELTA ELECTRONICS, INC., Taoyuan (TW)

(72) Inventors: Wei-Hsiang Chao, Taoyuan (TW); Po-Chin Chuang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/907,174

(22) Filed: Jun. 20, 2020

(65) Prior Publication Data

US 2020/0321960 A1  Oct. 8, 2020

Related U.S. Application Data

(63) Continuation-in-part of application No. 16/234,598, filed on Dec. 28, 2018, now Pat. No. 10,734,882.

(60) Provisional application No. 62/628,692, filed on Feb. 9, 2018.

(51) Int. Cl.
  *H03K 17/687* (2006.01)
(52) U.S. Cl.
  CPC .................. *H03K 17/687* (2013.01)
(58) Field of Classification Search
  CPC ..... H03K 17/687; H03K 17/082; H03K 17/06
  See application file for complete search history.

(56) References Cited

U.S. PATENT DOCUMENTS

| | | | |
|---|---|---|---|
| 6,628,532 B1 | 9/2003 | Rinne et al. | |
| 7,907,001 B2 | 3/2011 | Mazzola | |
| 2004/0061521 A1* | 4/2004 | Watanabe | H03K 19/018521 326/62 |
| 2004/0169973 A1 | 9/2004 | Koch | |
| 2005/0046402 A1* | 3/2005 | Kameda | G09G 3/22 323/282 |
| 2013/0301170 A1 | 11/2013 | Wagoner et al. | |
| 2013/0328610 A1 | 12/2013 | Hayashi | |
| 2014/0042452 A1 | 2/2014 | Pendharkar et al. | |

(Continued)

FOREIGN PATENT DOCUMENTS

| | | |
|---|---|---|
| CN | 104283198 A | 1/2015 |
| CN | 105009430 A | 10/2015 |

(Continued)

*Primary Examiner* — Sibin Chen
(74) *Attorney, Agent, or Firm* — CKC & Partners Co., LLC

(57) ABSTRACT

A conversion circuit includes a main device and a voltage control switching circuit. The voltage control switching circuit includes a first terminal configured to receive an original signal, a second terminal coupled to the control terminal of the main device and configured to transmit a driving signal to drive the main device, and a reference terminal coupled to the second terminal of the main device. A voltage level of the driving signal is generated by the voltage control switching circuit. The voltage control switching circuit further includes a first voltage-control switch. The first drain terminal of the voltage-control switch is coupled to the first terminal. The first source terminal of the voltage-control switch is coupled to the second terminal. The first gate terminal of the voltage-control switch is coupled to the reference terminal.

10 Claims, 14 Drawing Sheets

(56) References Cited

U.S. PATENT DOCUMENTS

2014/0320198 A1   10/2014  Eckel et al.
2016/0013636 A1    1/2016  Cai et al.
2017/0359055 A1   12/2017  Li
2018/0034368 A1    2/2018  Sugahara

FOREIGN PATENT DOCUMENTS

| | | |
|---|---|---|
| CN | 105427793 A | 3/2016 |
| DE | 102014108576 A1 | 12/2015 |
| EP | 2009792 A2 | 12/2008 |
| EP | 2632046 A1 | 8/2013 |
| TW | 201526499 A | 7/2015 |
| TW | 201803271 A | 1/2018 |
| WO | 2008/155917 A1 | 12/2008 |
| WO | 2013/156811 A1 | 10/2013 |
| WO | 2017053333 A1 | 3/2017 |
| WO | 2017/199949 A1 | 11/2017 |

* cited by examiner

CONVERSION CIRCUIT

RELATED APPLICATIONS

This application is a Continuation-in-part of U.S. application Ser. No. 16/234,598, filed on Dec. 28, 2018, which claims priority of U.S. Provisional Application Ser. No. 62/628,692, filed on Feb. 9, 2018, the entirety of which is incorporated by reference herein in their entireties.

BACKGROUND

Technical Field

The present disclosure relates to a power supply device, and in particular, to a conversion circuit in the power supply device.

Description of Related Art

For existing conversion circuit for the power converters, the supplying voltage is designed in response to the rated voltage of the semiconductor device to be driven. Therefore, one or more additional voltage regulators are required to regulate the system supplying power to meet the voltage requirement of the conversion circuit and the semiconductor device.

SUMMARY

One aspect of the present disclosure is a conversion circuit, comprising a main device and a voltage control switching circuit. The main device comprises a first terminal, a second terminal and a control terminal. The voltage control switching circuit comprises a first terminal, a second terminal, a reference terminal and first voltage-control switch. The first terminal is configured to receive an original signal. The second terminal is coupled to the control terminal of the main device, and is configured to transmit a driving signal to drive the main device. The reference terminal is coupled to the second terminal of the main device. The voltage level of the driving signal is generated by the voltage control switching circuit. The first voltage-control switch comprises a first drain terminal coupled to the first terminal of the voltage control switching circuit, a first source terminal coupled to the second terminal of the voltage control switching circuit, and a first gate terminal coupled to the reference terminal of the voltage control switching circuit.

Another aspect of the present disclosure is a conversion circuit, comprising a signal generator and a voltage control switching circuit. The signal generator is configured to receive an input voltage from a voltage source and generate an original signal. The voltage control switching circuit comprises a first terminal, a second terminal, a reference terminal and a first voltage-control switch. The first terminal is configured to receive the original signal. The second terminal is configured to output a driving signal in response to the original signal. The reference terminal is coupled to the signal generator. A current passing through the voltage control switching circuit is controlled in response to a voltage level of the reference terminal. The first voltage-control switch comprises a first drain terminal coupled to the first terminal of the voltage control switching circuit, a first source terminal coupled to the second terminal of the voltage control switching circuit, and a first gate terminal coupled to the reference terminal of the voltage control switching circuit. A voltage level of the original signal is higher than the voltage level of the driving signal.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
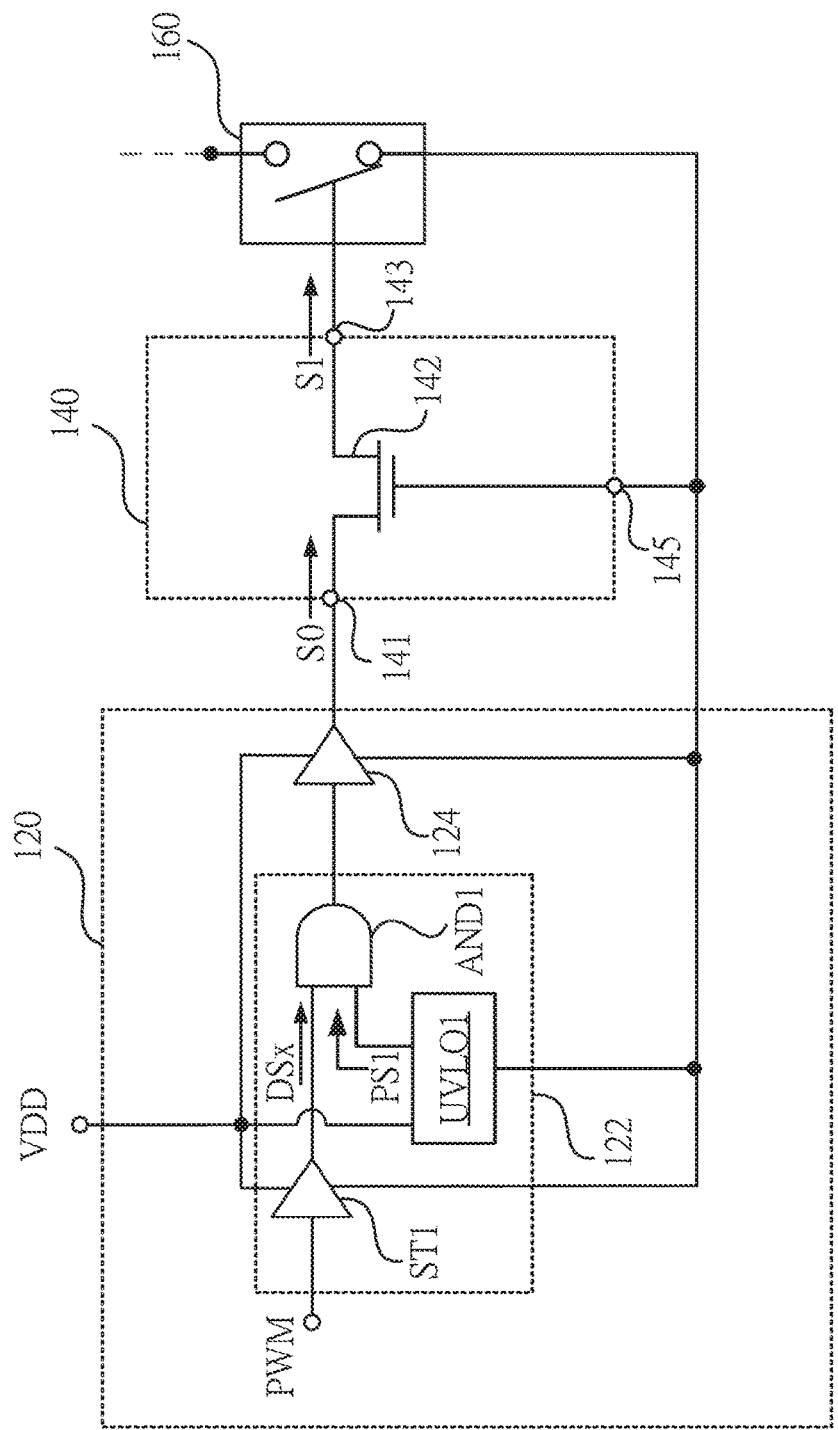
FIG. 1 is a diagram illustrating a conversion circuit according to some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Reference is made to FIG. 1. FIG. 1 is a diagram illustrating a conversion circuit 100 according to some embodiments of the present disclosure. As shown in FIG. 1, the conversion circuit 100 includes a signal generator 120, a voltage control switching circuit 140 and a main device 160. The signal generator 120 includes a logic circuit 122 and a driver buffer 124, and is configured to receive an input voltage VDD from a voltage source and generate an original signal S0.

Specifically, the input voltage VDD is provided to the logic circuit 122 and the driver buffer 124 to supply the required power. In some embodiments, the logic circuit 122 is configured to generate the original signal S0 according to a pulse-width modulation (PWM) signal PWM.

For example, as shown in FIG. 1, the logic circuit 122 may include a Schmitt trigger ST1, an Under-Voltage Lockout (UVLO) circuit UVLO1, and an AND gate AND1. The Schmitt trigger is ST1 configured to receive the pulse-width modulation (PWM) signal PWM, and output a signal DSx, in which the value of the signal DSx retains the value until the pulse-width modulation signal PWM at the input terminal changes sufficiently to trigger a change.

The Under-Voltage Lockout (UVLO) circuit UVLO1 is configured to monitor the input voltage VDD and provide a protection signal PS1 on the condition that under voltage occurs. The AND gate AND1 is coupled to the Schmitt trigger ST1, and the Under-Voltage Lockout (UVLO) circuit UVLO1 at the input side, and perform an AND operation correspondingly to output the dri original ving signal S0 in response to the received signals. The original signal S0 is transmitted to the driver buffer 124 coupled to the logic circuit 122, and the driver buffer 124 is configured to output the original signal S0 via an output terminal.

In structural, the voltage control switching circuit 140 includes a first terminal 141, a second terminal 143 and a reference terminal 145. As shown in FIG. 1, in some embodiments, the first terminal 141 is coupled to the output terminal of the driver buffer 124. The second terminal 143 is coupled to a control terminal of the main device 160. The reference terminal 145 is coupled to the reference terminal of the driver buffer 124 and a second terminal of the main device 160.

The voltage control switching circuit 140 is configured to receive the original signal S0 via the first terminal 141, and transmit a driving signal S1 to drive the main device 160 via the second terminal 143. The current passing through the voltage control switching circuit 140 is controlled in response to a voltage level of the reference terminal 145. In addition, in some embodiments, the voltage control switching circuit 140 is normally-on in response to a zero gate-source voltage at the reference terminal 145.

For example, as shown in FIG. 1, in some embodiments, the voltage control switching circuit 140 may include a voltage-control switch 142. A drain terminal of the voltage-control switch 142 is coupled to the first terminal 141. A source terminal of the voltage-control switch 142 is coupled to the second terminal 143. A gate terminal of the voltage-control switch 142 is coupled to the reference terminal 145. The voltage-control switch 142 may include a depletion type metal-oxide-semiconductor field-effect transistor (MOSFET) switching device to achieve the normally-on operation in response to the zero gate-source voltage at the reference terminal 145, but the present disclosure is not limited thereto. In some other embodiments, the voltage-control switch 142 may include other suitable semiconductor devices having similar channel current to gate voltage characteristics to achieve the voltage-control switch 142. Alternatively stated, the voltage-control switch 142 may include a depletion type MOSFET switching device, an enhancement type MOSFET switching device, or any combination thereof.

Figure 2:
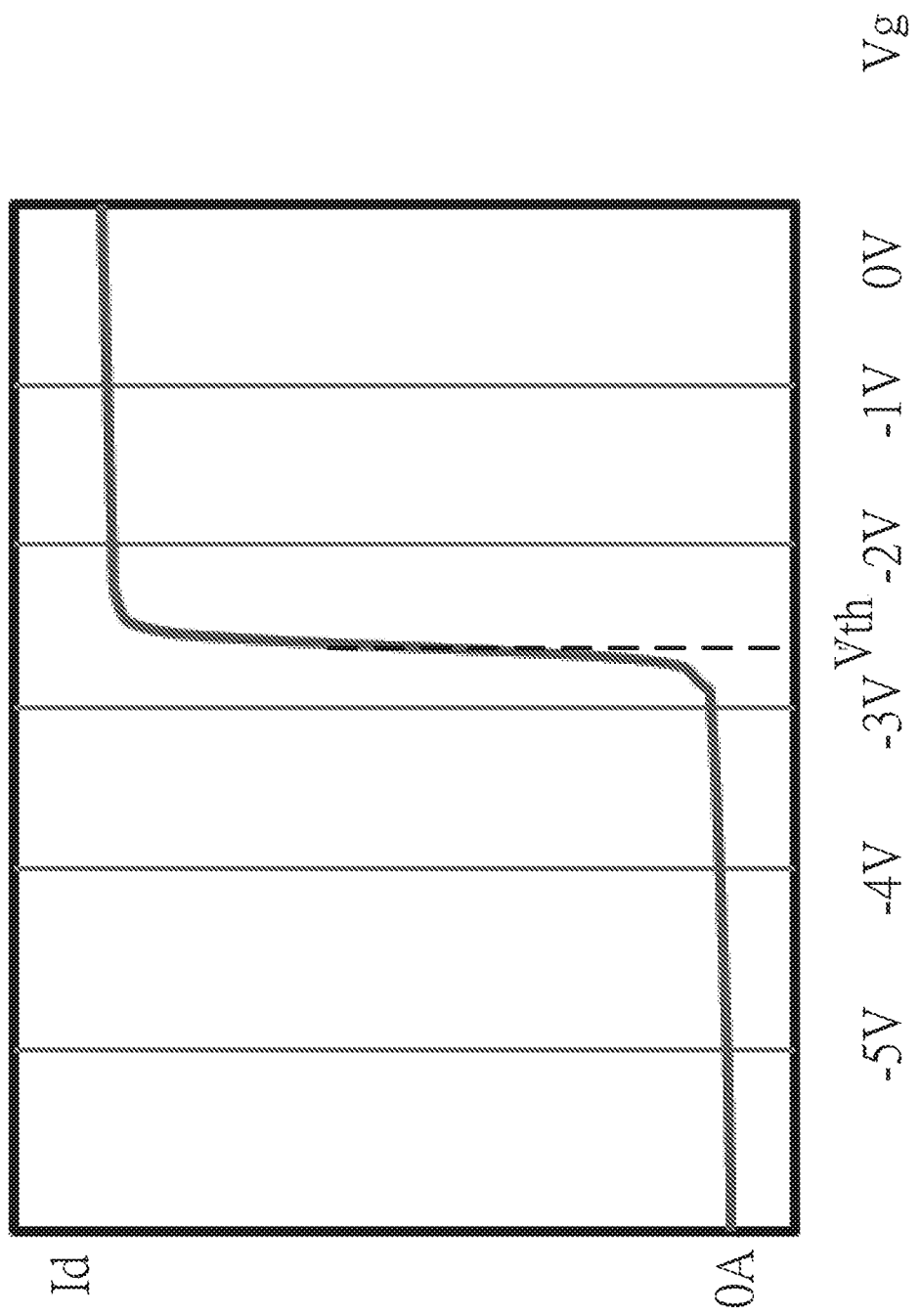
FIG. 2 is a diagram illustrating the characteristic curve of the channel current to the gate voltage of the voltage control switching circuit according to some embodiment of the present disclosure.

Reference is made to FIG. 2. FIG. 2 is a diagram illustrating the characteristic curve of the channel current (Id) to the gate voltage (Vg) of the voltage control switching circuit 140 according to some embodiment of the present disclosure.

As shown in FIG. 2, the voltage control switching circuit 140 is normally-on in response to the zero gate-source voltage at the reference terminal 145. The threshold voltage Vth of the voltage control switching circuit 140 is negative, and the voltage control switching circuit 140 is configured to be off on the condition that the gate-source voltage is smaller than the negative threshold voltage Vth. In some embodiments, the threshold voltage Vth is the threshold voltage of the MOSFET switching device. For example, in some embodiments, the threshold voltage of the normally-on device is between −0.1 volts and −20 volts.

Accordingly, the voltage level of the driving signal S1 will be clamped by the voltage control switching circuit 140 in response to the threshold voltage Vth of the voltage control switching circuit 140 on the condition that the voltage level of the original signal S0 is higher than a specific value. Alternatively stated, the voltage level of the original signal S0 is higher than the voltage level of the driving signal S1 since the voltage level of the driving signal S1 is clamped by the voltage control switching circuit 140.

Therefore, in some embodiments, the signal generator 120 may receive the same input voltage VDD having a relative high level (e.g., 12V) directly from the voltage source, and correspondingly output the original signal S0 with a high level. Since the voltage level of the driving signal S1 is clamped to be lower than using the voltage control switching circuit 140, the main device 160 is prevented from damages resulting from driving signals with voltage level greater than the upper safety limit. Thus, in some embodiments, no additional regulator is required in the signal generator 120 to lower the input voltage VDD received from the voltage source, and the signal generator 120 may apply the voltage source of the system directly. Furthermore, in some embodiments, the high voltage resulted from the electrostatic discharge (ESD) may also be isolated by the voltage control switching circuit 140 to protect the main device 160 from damaging.

Figure 3:
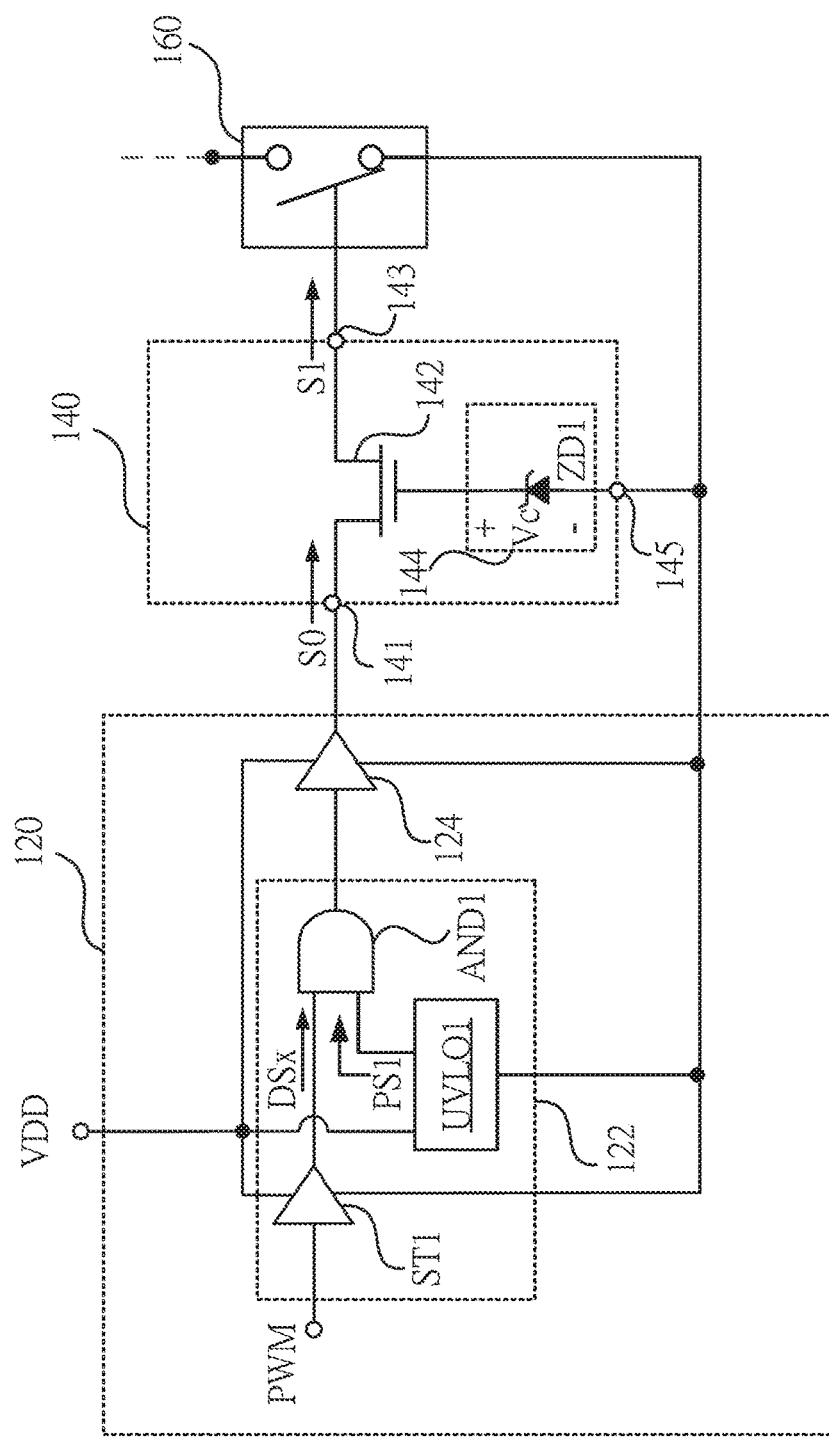
FIG. 3 is a diagram illustrating the conversion circuit according to some other embodiments of the present disclosure.

Reference is made to FIG. 3. FIG. 3 is a diagram illustrating the conversion circuit 100 according to some other embodiments of the present disclosure. With respect to the embodiments of FIG. 3, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3.

Compared to the embodiments shown in FIG. 2, in the conversion circuit 100 of FIG. 3, the voltage control switching circuit 140 further include a clamping circuit 144 electrically coupled between the gate terminal of the voltage-control switch 142 and the reference terminal 145 of the voltage control switching circuit 140. As shown in FIG. 3, in structural, the gate terminal of the voltage-control switch 142 is coupled to a first terminal of the clamping circuit 144, and a second terminal of the clamping circuit 144 is coupled to the reference terminal 145 of the voltage control switching circuit 140.

The clamping circuit 144 is configured to clamp a voltage Vc across the first terminal and the second terminal of the clamping circuit 144 to a predetermined level. For example, as shown in FIG. 3, in some embodiments, the clamping circuit 144 may include a Zener diode ZD1. Accordingly, the voltage Vc across the first terminal and the second terminal of the clamping circuit 144 is clamped to the predetermined level corresponding to the breakdown voltage of the Zener diode ZD1.

Since the voltage Vc is clamped to the predetermined level, the voltage-control switch 142 with a lower threshold voltage may be applied to adjust the voltage level of the driving signal S1, such that the entire circuit can operate flexibly. In addition, the voltage-control switch 142 with the same threshold voltage may be applied to the main device 160 having higher rated voltage by introducing the clamping circuit 144 to provide the clamped voltage Vc. Accordingly, the clamped voltage Vc of the clamping circuit 144 is provided to increase the rated voltage of the main device 160. Alternatively stated, the voltage level of the driving signal S1 can be adjusted based on the clamped voltage Vc, without exceeding the rated voltage of the main device 160.

Figure 4B:
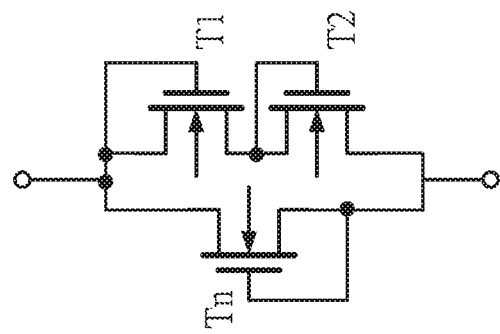
FIG. 4A and FIG. 4B are diagrams illustrating approaches to implement the clamping circuit according to some embodiments of the present disclosure.
Figure 4A:
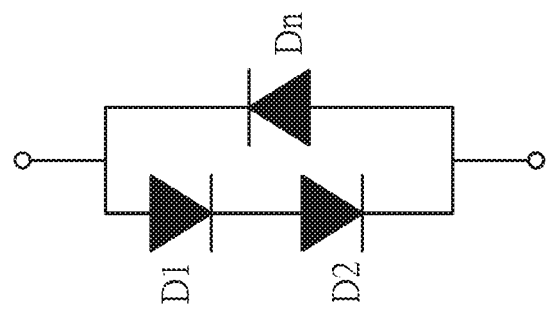

Reference is made to FIG. 4A and FIG. 4B together. FIG. 4A and FIG. 4B are diagrams illustrating other approaches to implement the clamping circuit 144 according to some embodiments of the present disclosure. As shown in FIG. 4A, in some alternative embodiments, the clamping circuit 144 may be realized by multiple diodes D1-Dn electrically coupled to each other. As shown in FIG. 4B, in some alternative embodiments, the clamping circuit 144 may be realized by multiple MOSFETs T1-Tn electrically coupled to each other. The gate terminal of one of the MOSFETs T1-Tn is electrically coupled to the source terminal or the drain terminal of another one of the MOSFETs T1-Tn. The number of the diodes D1-Dn or the MOSFETs T1-Tn may be adjusted according to actual needs and thus the present disclosure is not limited to examples shown in FIG. 4A and FIG. 4B.

Figure 5:
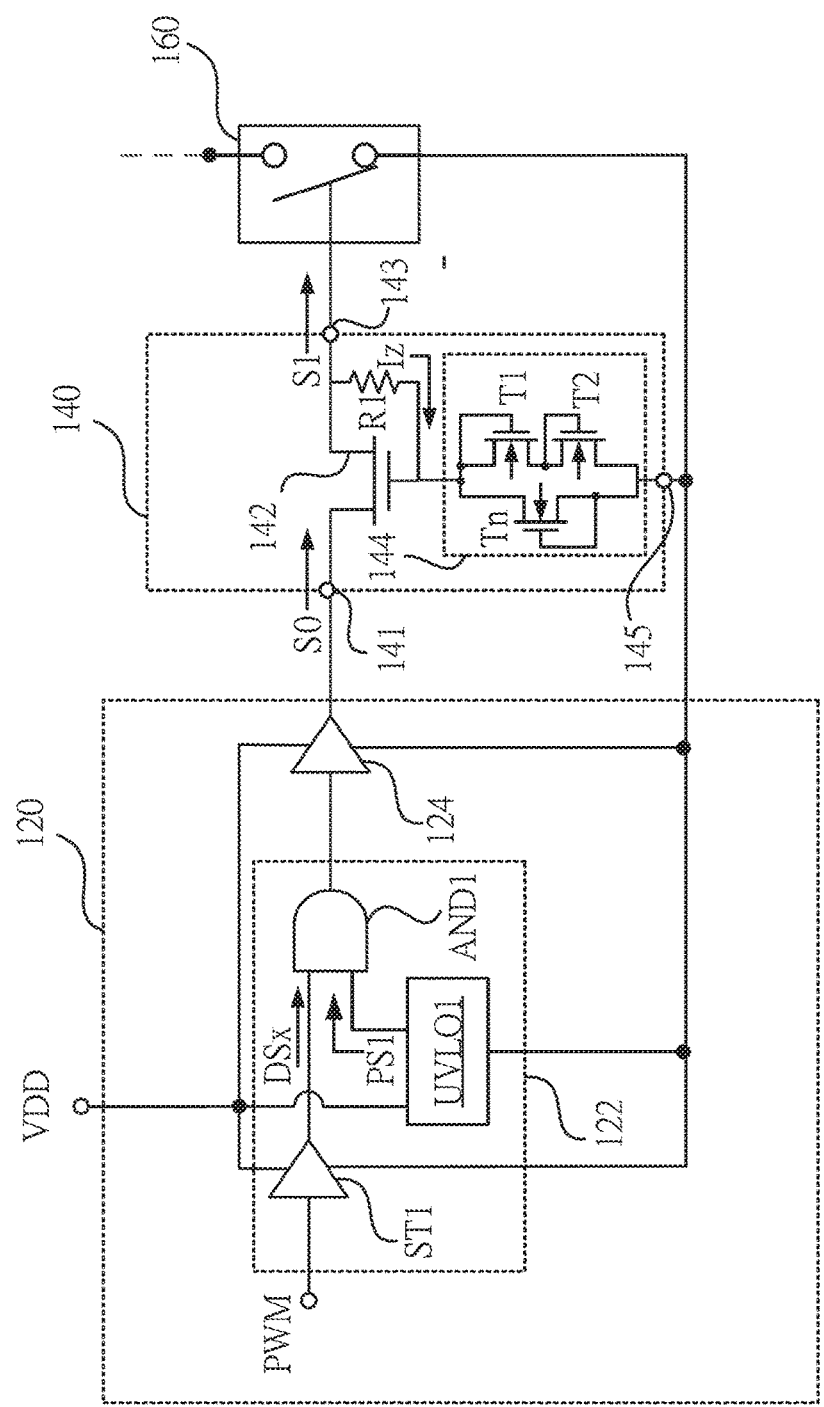
FIG. 5 is a diagram illustrating the conversion circuit according to some other embodiments of the present disclosure.

Reference is made to FIG. 5. FIG. 5 is a diagram illustrating the conversion circuit 100 according to some other embodiments of the present disclosure. With respect to the embodiments of FIG. 5, like elements in FIG. 1 and FIG. 3 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 1 and FIG. 3.

Compared to the embodiments shown in FIG. 3, in the conversion circuit 100 of FIG. 5, the voltage control switching circuit 140 further includes a resistor R1. The first terminal of the resistor R1 is coupled to the source terminal of the voltage-control switch 142, and the second terminal of the resistor R1 is coupled to the gate terminal of the voltage-control switch 142. In some embodiments, the resistor R1 may be realized by the on-resistance of the MOSFET. In some alternative embodiments, the resistor R1 may be the equivalent resistance of the gate-to-source leakage current of the voltage-control switch 142. The resistor R1 may provide a current path for the current Iz flowing through the clamping circuit 144 in order to protect the main device 160.

In various embodiments of the present disclosure, the main device 160 may be the power switching element applied in various switching power supply devices, such as a buck converter, a boost converter, a buck-boost converter or any other devices having power switches. For example, the main device 160 may include a Gallium Nitride (GaN) switching device, a MOSFET switching device, an Insulated Gate Bipolar Transistor (IGBT) switching device, a bipolar junction transistor (BJT) switching device, a Silicon Carbide (SiC) switching device, a relay switching device, or any combination thereof.

Reference is made to FIG. 6A-FIG. 6D. FIG. 6A-FIG. 6D are diagrams illustrating integration of the voltage control switching circuit 140 and the main device 160 according to some embodiments of the present disclosure.

Figure 6B:
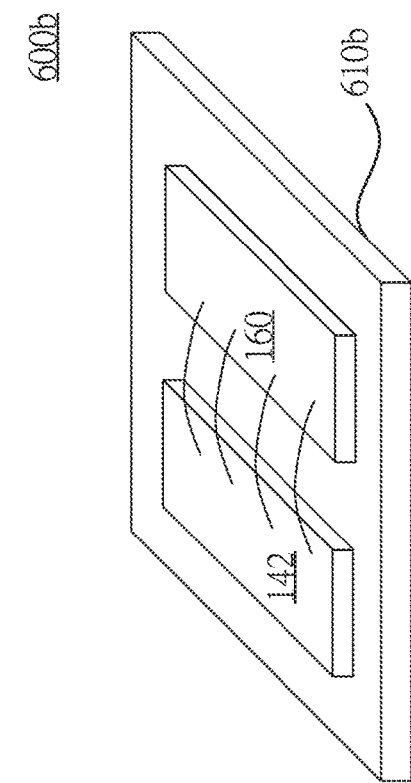
FIG. 6A-FIG. 6D are diagrams illustrating integration of the voltage control switching circuit and the main device according to some embodiments of the present disclosure.
Figure 6D:
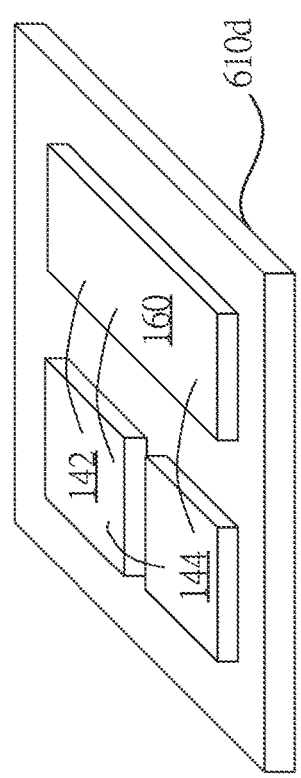
Figure 6A:
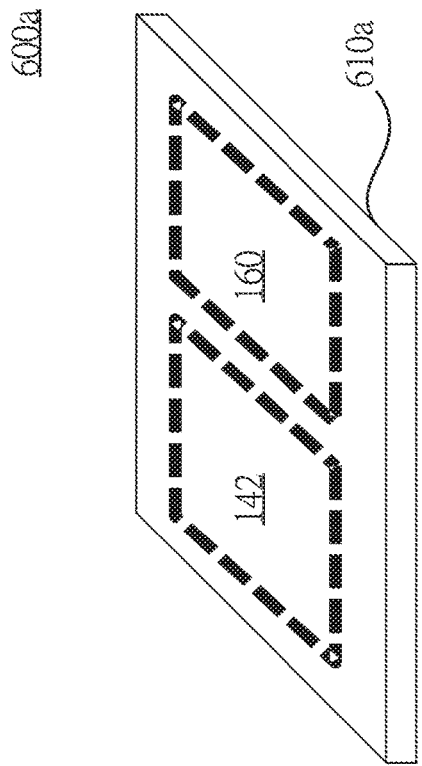

Corresponding to the embodiments shown in FIG. 1, as shown in FIG. 6A, in some embodiments, the normally-on voltage-control switch 142 and the main device 160 are integrated or packaged together with System on Chip (SoC) on a substrate 610a to form a chip 600a. As shown in FIG. 6B, in some embodiments, the normally-on voltage-control switch 142 and the main device 160 are integrated or packaged together with System in Package (SiP) on a substrate 610b to form a package 600b. In various embodiments, SiP dies may be stacked vertically or tiled horizontally and internally connected by wires that are bonded to the package.

Figure 6C:
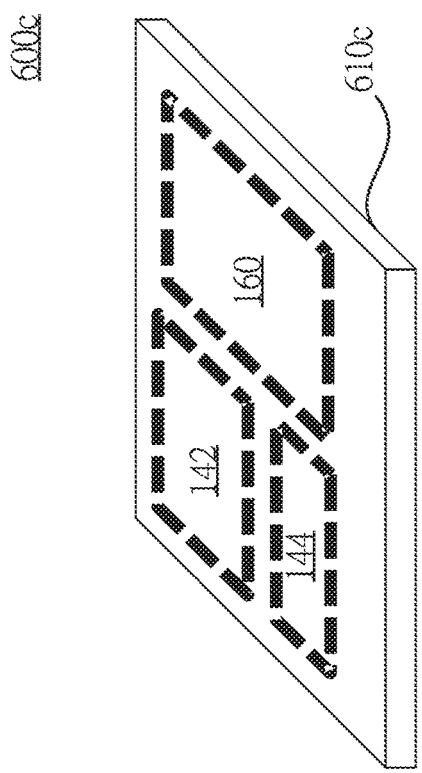

Corresponding to the embodiments shown in FIG. 3, as shown in FIG. 6C, in some embodiments, the normally-on voltage-control switch 142, the clamping circuit 144, and the main device 160 are integrated or packaged together with System on Chip (SoC) on a substrate 610c to form a chip 600c. As shown in FIG. 6D, in some embodiments, the normally-on voltage-control switch 142, the clamping circuit 144, and the main device 160 are integrated or packaged together with System in Package (SiP) on a substrate 610d to form a package 600d.

In other words, in various embodiments, the voltage control switching circuit 140 and the main device 160 may be integrated or packaged together with System in Package, System on Chip, three-dimensional integrated circuit (3D IC), etc.

Figure 7B:
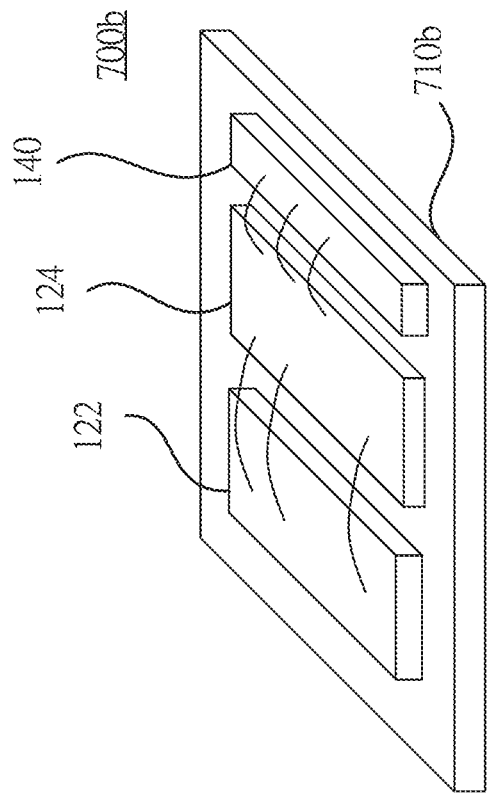
FIG. 7A and FIG. 7B are diagrams illustrating integration of the signal generator and the voltage control switching circuit according to some embodiments of the present disclosure.
Figure 7A:
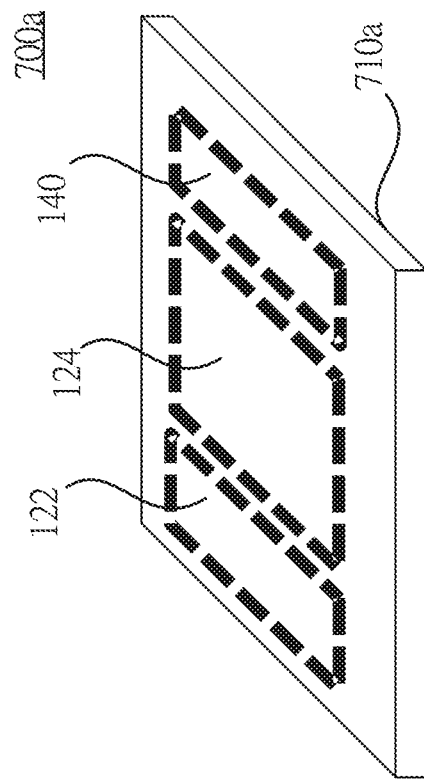

Reference is made to FIG. 7A and FIG. 7B. FIG. 7A and FIG. 7B are diagrams illustrating integration of the signal generator 120 and the voltage control switching circuit 140 according to some embodiments of the present disclosure. Corresponding to the embodiments shown in FIG. 1, as shown in FIG. 7A, in some embodiments, the logic circuit 122, the driver buffer 124, and the voltage control switching circuit 140 are integrated or packaged together with System on Chip (SoC) on a substrate 710a to form a chip 700a. As shown in FIG. 7B, in some embodiments, the logic circuit 122, the driver buffer 124, and the voltage control switching circuit 140 are integrated or packaged together with System in Package (SiP) on a substrate 710b to form a package 700b.

In other words, in various embodiments, similar to the integration applied to the voltage control switching circuit 140 and the main device 160, in some embodiments, the signal generator 120 and the voltage control switching circuit 140 may be integrated or packaged together with System in Package, System on Chip, 3D IC, etc.

In some other embodiments, the signal generator 120, the voltage control switching circuit 140 and the main device 160 may also be integrated or packaged together with System in Package, System on Chip, 3D IC, etc, and further explanation is omitted herein for the sake of brevity.

In addition, the elements in the above embodiments may be implemented by various digital or analog circuits, and may also be implemented by different integrated circuit chips. Each element may also be integrated in a single chip. It is noted that, in an actual implementation, the circuits may be realized by a microcontroller unit (MCU), or by be realized in various ways such as by a digital signal processor (DSP), a field-programmable gate array (FPGA), etc. The switches and transistors may be realized by proper devices. For example, the switches may be implemented by power semiconductor devices including but not limited to Insulated Gate Bipolar Transistors (IGBTs), bipolar junction transistors (BJTs), SiC metal-oxide-semiconductor field-effect transistors (MOSFET), or mechanical switches, such as various types of relays. The normally-on switching devices may be GaN transistors or semiconductors devices with similar I-V characteristics. Transformer, diodes, resistors, capacitor units and/or inductors units may be realized by suitable electronic elements. The above list is merely exemplary and is not meant to be limitations of the present disclosure.

In summary, in various embodiments of the present disclosure, by arranging the normally-on voltage control switching circuit 140 between the signal generator 120 and the main device 160, no extra regulation circuit is required and the driver may directly apply the system power to provide driving signals to the power semiconductors devices. Furthermore, the normally-on voltage control switching circuit 140 may protect the power semiconductors devices from the high voltage due to the electrostatic discharge.

Figure 8A:
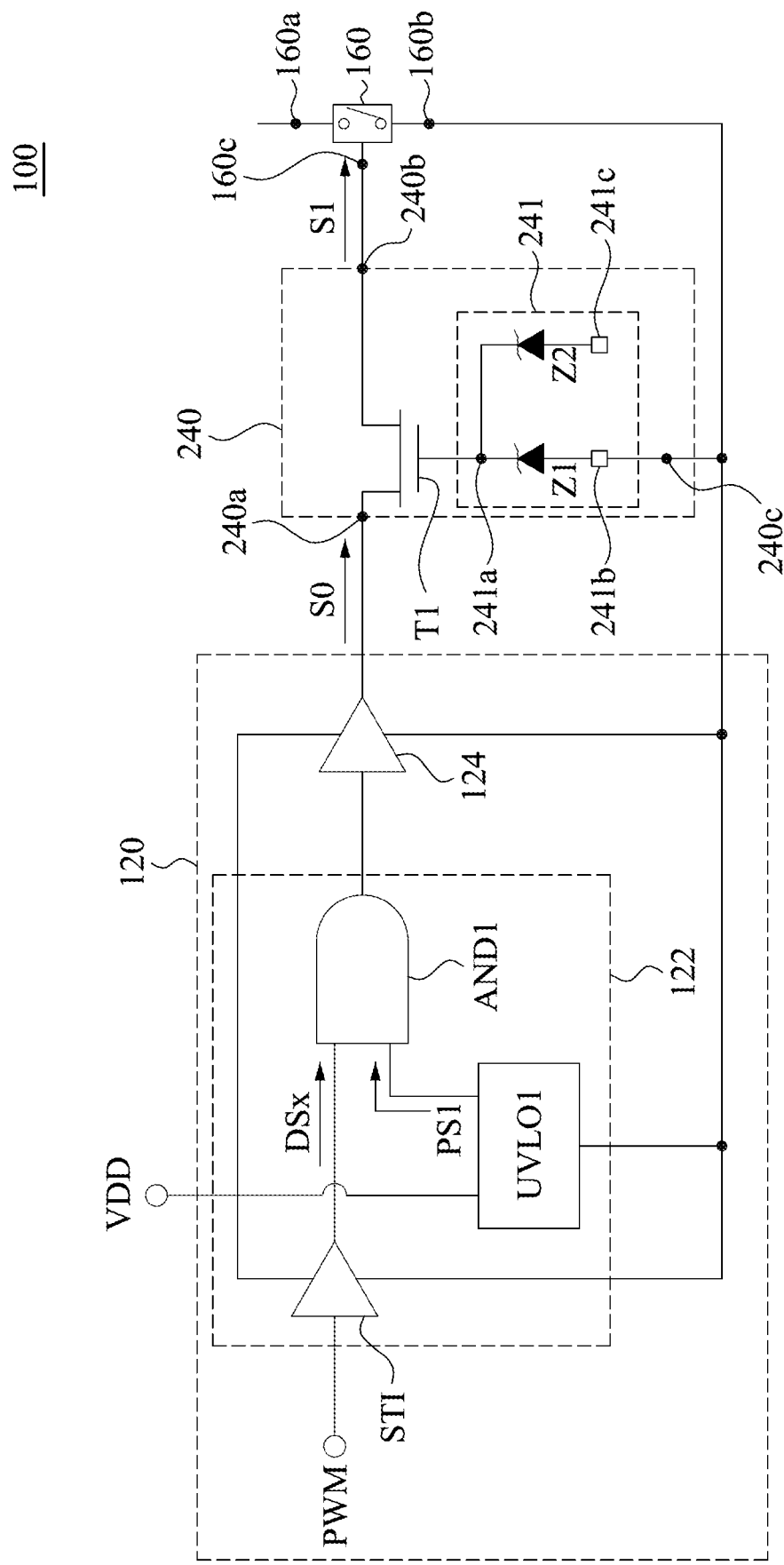
FIG. 8A is a diagram illustrating the conversion circuit according to some other embodiments of the present disclosure.
Figure 8B:
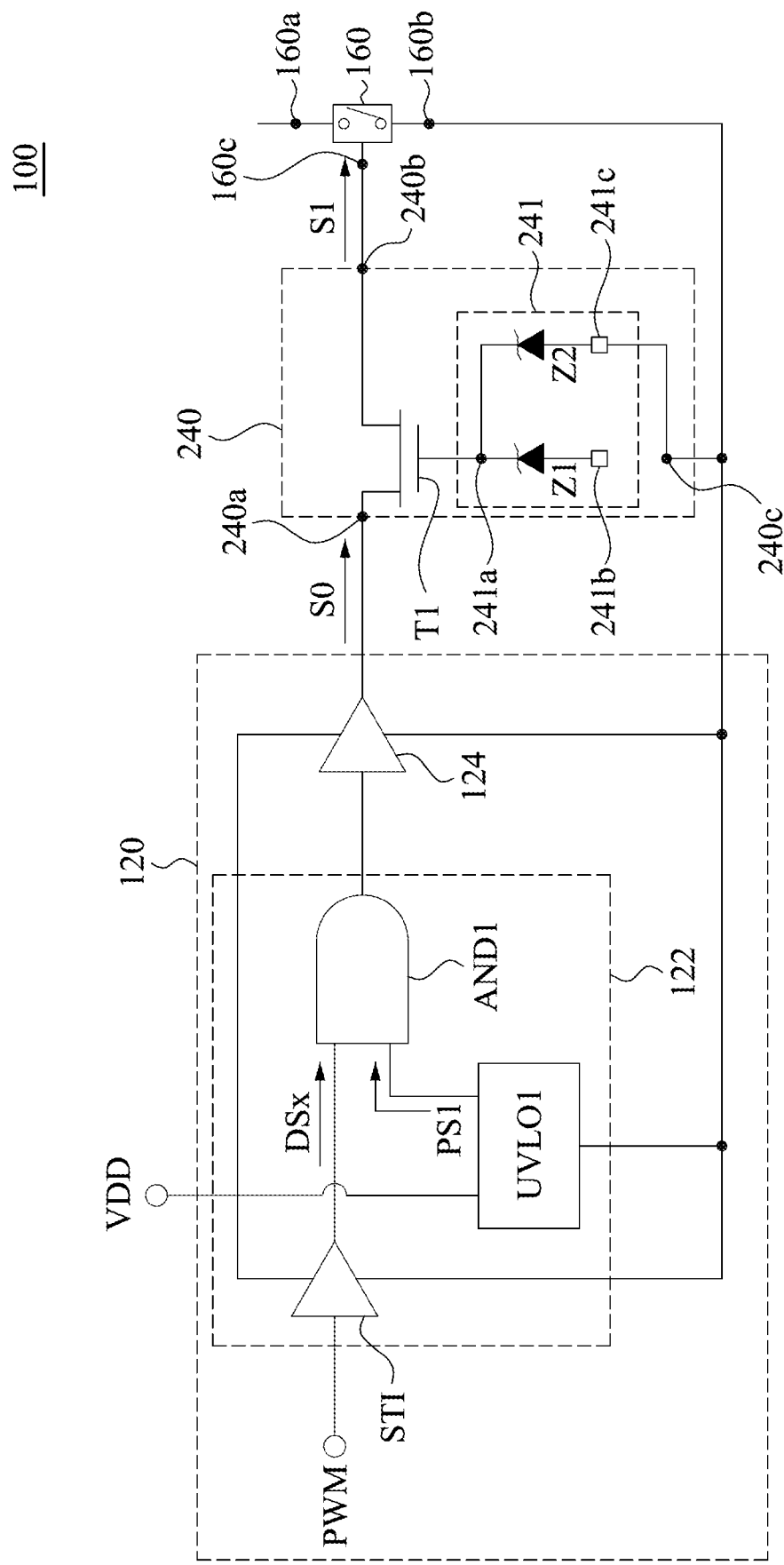
FIG. 8B is a diagram illustrating the conversion circuit according to some other embodiments of the present disclosure.

Reference is made to FIG. 8A and FIG. 8B. FIG. 8A and FIG. 8B are diagrams illustrating the conversion circuit 100 according to some other embodiments of the present disclosure. With respect to the embodiments of FIG. 8A and FIG. 8B, like elements in FIG. 3 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8A and FIG. 8B.

The voltage control switching circuit 240 is configured to receive the original signal S0 from the signal generator 120, and is configured to generate a driving signal S1. The voltage control switching circuit 240 drives the main device 160 according to the driving signal S1.

In some embodiments, the voltage control switching circuit 240 includes a first voltage-control switch T1 and a clamping circuit 241. The first voltage-control switch T1 may include a depletion type MOSFET switching device, an enhancement type MOSFET switching device, or any combination thereof. A first drain terminal of the first voltage-control switch T1 is coupled to the first terminal 240a of the voltage control switching circuit 240. A first source terminal of the first voltage-control switch T1 is coupled to the second terminal 240b of the voltage control switching circuit 240. A first gate terminal of the first voltage-control switch T1 is coupled to the reference terminal 240c of the voltage control switching circuit 240.

In structural, a first terminal 241a of the clamping circuit 241 is coupled to the first gate terminal of the first voltage-control switch T1. A second terminal 241b of the clamping circuit 241 is coupled to the reference terminal 240c of the voltage control switching circuit 240. The voltage across the first terminal 241a and the second terminal 241b of the clamping circuit 241 is clamped to a predetermined level. The voltage level of the driving signal S1 is generated by the voltage control switching circuit 240 in response to a threshold voltage generated by the first voltage-control switch T1.

In some embodiments, the clamping circuit 241 further includes multiple clamping elements such as the first clamping element Z1 and the second clamping element Z2. Each of the clamping elements may be implemented in or implemented by a Zener diode. The clamping elements Z1, Z2 are coupled to the first gate terminal of the first voltage-control switch T1, and at least one of the clamping elements Z1, Z2 is further coupled to the reference terminal 240c. As shown in FIG. 8A, the clamping element Z1 is coupled between the first gate terminal of the first voltage-control switch T1 and the reference terminal 240c, but the clamping element Z2 is disconnected to the reference terminal 240c.

On the other hand, referring to the FIG. 8B, the clamping element Z2 is coupled between the first gate terminal of the first voltage-control switch T1 and the reference terminal 240c, but the clamping element Z1 is disconnected to the reference terminal 240c. In other some embodiments, both of the clamping elements Z1, Z2 may be coupled between the first gate terminal of the first voltage-control switch T1 and the reference terminal 240c. The user can selectively couple the clamping element Z1 and/or the clamping element Z2 between the first gate terminal of the first voltage-control switch T1 and the reference terminal 240c.

In structural, the clamping circuit 241 includes a first terminal 241a, a second terminal 241b and a third terminal 241c. The positive terminals of the clamping elements Z1, Z2 are coupled to the first terminal 241a (or the first gate terminal of the first voltage-control switch T1). The negative terminal of the clamping elements Z1 are coupled to the second terminal 241b, and the negative terminal of the clamping elements Z2 are coupled to the third terminal 241c.

The second terminal 241b and the third terminal 241c are selectively connected to the reference terminal 240c, respectively.

Since characteristics of each electronic component in the voltage control switching circuit 240 (e.g., the first voltage-control switch T1) will have different variations due to different production conditions of the semiconductor process, it might affect the accuracy of the voltage value of the driving signal S1 outputted by the voltage control switching circuit 240. Therefore, after the conversion circuit 100 is completely fabricated, the user may selectively couple the clamping element Z1 and/or the clamping element Z2 between the first gate terminal of the first voltage-control switch T1 and the reference terminal 240c. The connection method can be realized by using various packaging methods, such as wire bonding, clip packaging technology, or by using PCB wiring connections on the system, but not limited to this.

For example, the control terminal 160c of the main device 160 needs an input voltage of 5 V, the clamping voltage of the clamping element Z1 is 3.9 V, and the clamping voltage of the clamping element Z2 is 4.3 V. If the threshold voltage of the first voltage-control switch T1 is detected as −1.1 V, the user can couple the clamping element Z1 between the first gate terminal of the first voltage-control switch T1 and the reference terminal 240c, but disconnects the clamping element Z2 from the reference terminal 240c as shown in FIG. 8A. On the other hand, if the threshold voltage of the first voltage-control switch T1 is detected as −0.7 V, the user can couple the clamping element Z2 between the first gate terminal of the first voltage-control switch T1 and the reference terminal 240c, but disconnects the clamping element Z1 from the reference terminal 240c as shown in FIG. 8B.

Figure 8C:
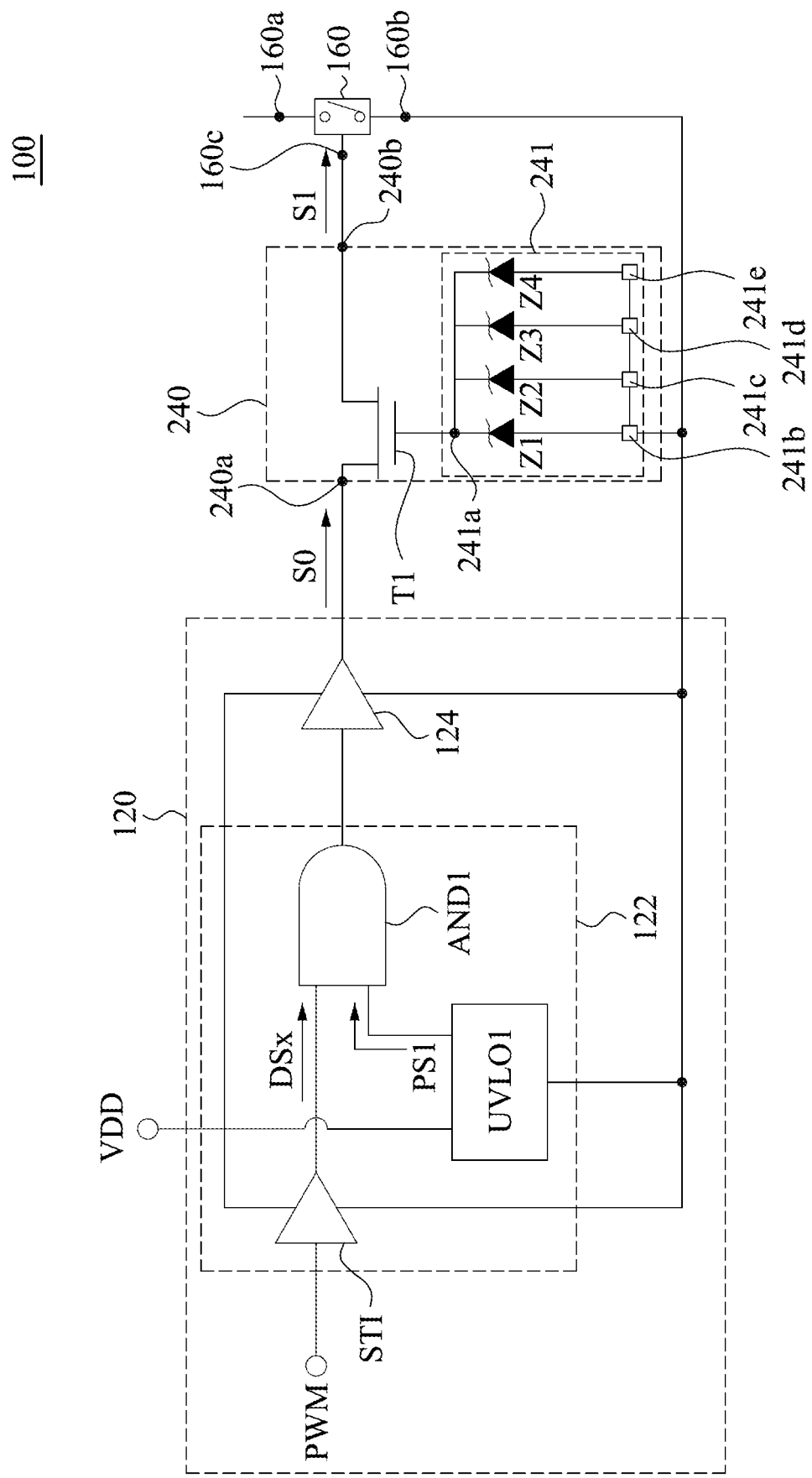
FIG. 8C is a diagram illustrating the conversion circuit according to some other embodiments of the present disclosure.

FIG. 8C is a diagram illustrating the conversion circuit 240 according to some other embodiments of the present disclosure. In some other embodiments, the clamping circuit 241 includes multiple (more than two) clamping elements such as the first clamping element Z1, the second clamping element Z2, the third clamping element Z3 and the fourth clamping element Z4. The clamping elements Z1-Z4 are coupled to the first gate terminal of the first voltage-control switch T1, and at least one of the clamping elements Z1-Z4 is further coupled to the reference terminal 240C. As shown in FIG. 8C, the clamping circuit 241 includes a first terminal 241a, a second terminal 241b, a third terminal 241c, a fourth terminal 241d and a fifth terminal 241e. The user can selectively couple at least one of the clamping elements Z1-Z4 between the first gate terminal of the first voltage-control switch T1 and the reference terminal 240c. Alternatively stated, the user can selectively couple at least one of the terminals 241b-241e to the reference terminal 240c.

Figure 9:
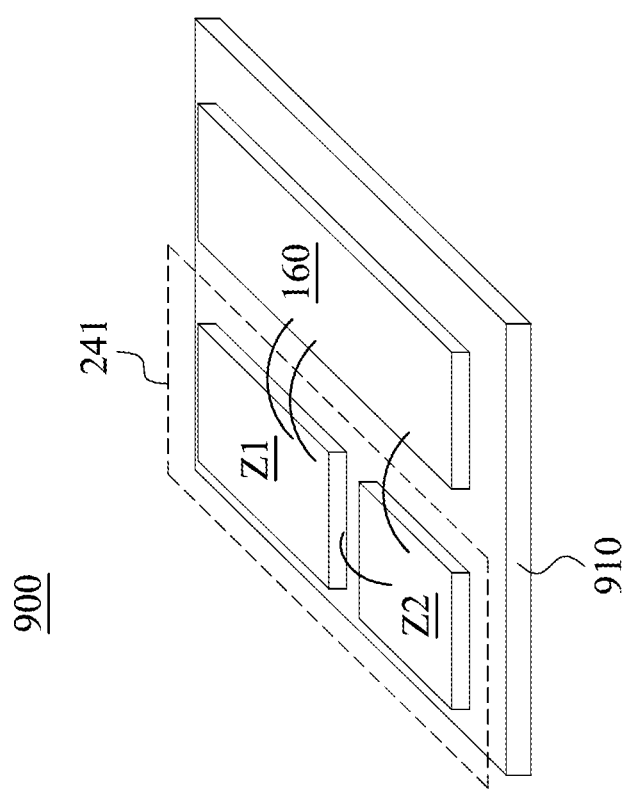
FIG. 9 is a diagram illustrating integration of the voltage control switching circuit and the main device according to some embodiments of the present disclosure.

Corresponding to the embodiments shown in FIG. 9, in some embodiments, the main device 160 and the clamping circuit 241 of one of the above embodiments are integrated or packaged together with System on Chip (SoC) on a substrate 910 to form a chip 900. For the sake of brevity, only two clamping elements Z1, Z2 are depicted in FIG. 9, but this disclosure is not limited thereto. In other words, in various embodiments, the clamping circuit 241 (or the voltage control switching circuit 240) and the main device 160 may be integrated or packaged together with System in Package, System on Chip, three-dimensional integrated circuit (3D IC), etc.

Figure 10A:
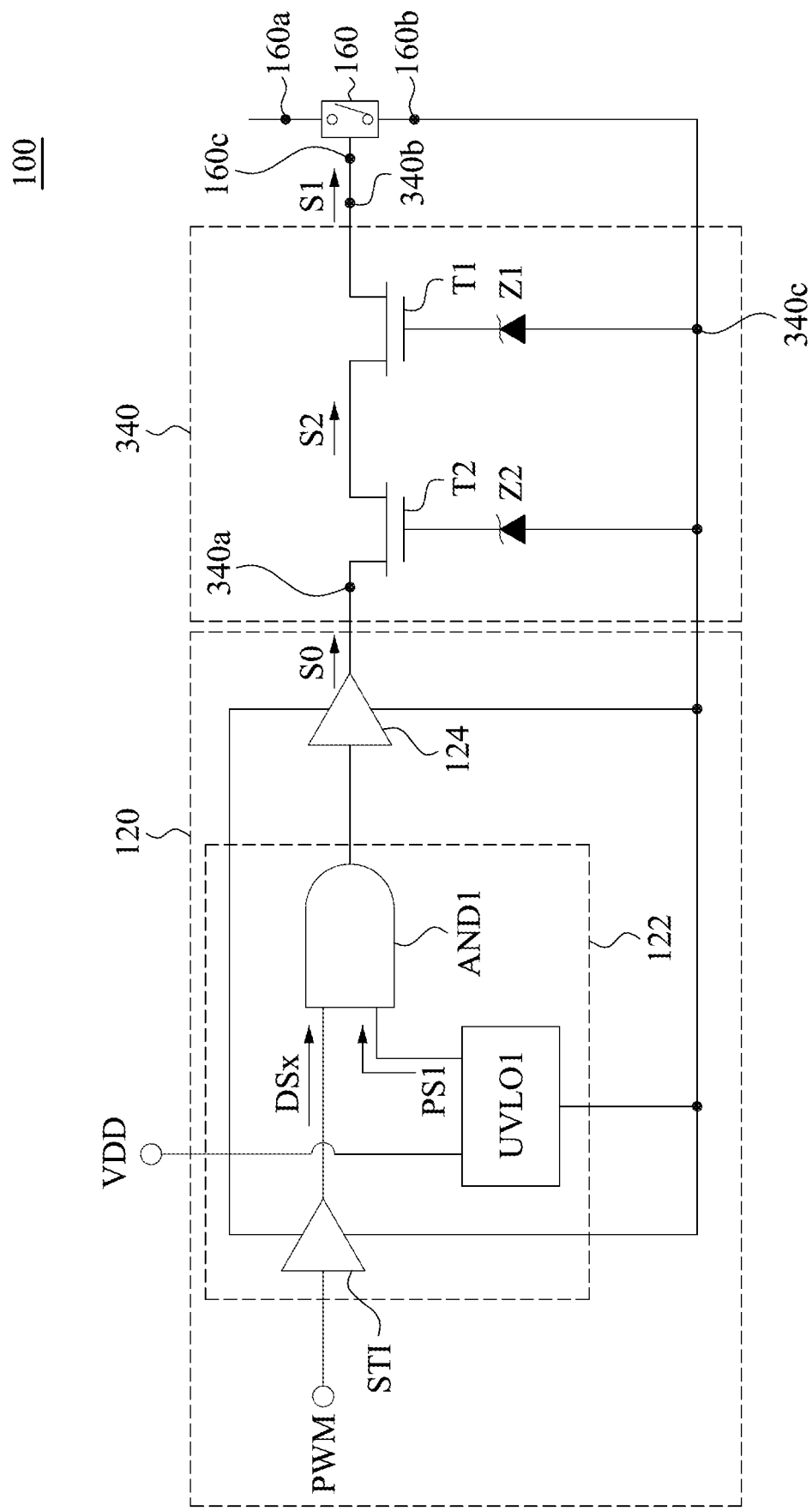
FIG. 10A is a diagram illustrating the conversion circuit according to some other embodiments of the present disclosure.

FIG. 10A is a diagram illustrating the conversion circuit 100 according to some other embodiments of the present disclosure. With respect to the embodiments of FIG. 10A, like elements in FIG. 3 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 10A.

In some embodiments, the voltage control switching circuit 340 includes the first voltage-control switch T1 and a second voltage-control switch T2. The second voltage-control switch T2 is coupled in series to the first voltage-control switch T1. The second voltage-control switch T2 receives the original signal S0 and generates the driving signal S2, then outputs the driving signal S2 to the first voltage-control switch T1. In specific, a second drain terminal of the second voltage-control switch T2 is coupled to the first terminal 340a of the voltage control switching circuit 340. A second source terminal of the second voltage-control switch T2 is coupled to the first drain terminal of the first voltage-control switch T1, and is coupled to the second terminal 340b of the voltage control switching circuit 340 through the first voltage-control switch T1. A second gate terminal of the second voltage-control switch T2 is coupled to the reference terminal 340c of the voltage control switching circuit 340.

The voltage level of the driving signal S2 will be clamped by the second voltage-control switch T2 in response to the threshold voltage Vth of the second voltage-control switch T2 on the condition that the voltage level of the original signal S0 is higher than a specific value. Similarly, the voltage level of the driving signal S1 will be clamped by the first voltage-control switch T1 in response to the threshold voltage Vth of the first voltage-control switch T1 on the condition that the voltage level of the driving signal S2 is higher than a specific value. Alternatively stated, the voltage level of the original signal S0 is higher than the voltage level of the driving signal S2, and the voltage level of the driving signal S2 is higher than the voltage level of the driving signal S1, so that the main device 160 is prevented from damages resulting from driving signals with voltage level greater than the upper safety limit.

As mentioned above, the conversion circuit 100 reduces the voltage level of the original signal S0 though multiple bust circuit (e.g., the first voltage-control switch T1 and the second voltage-control switch T2) sequentially to reduce the voltage load that a single group of voltage-control switch need to withstand. In some other embodiments, multiple voltage-control switches can be connected in series between the signal generator 120 and the first voltage-control switch T1.

In some embodiments, the voltage control switching circuit 340 further includes a first clamping element Z1 and a clamping element Z2. The clamping element Z1 is electrically coupled between the gate terminal of the first voltage-control switch T1 and the reference terminal 340c. The clamping element Z2 is electrically coupled between the gate terminal of the second voltage-control switch T2 and the reference terminal 340c. The clamping elements Z1, Z2 may be implemented in or implemented by a Zener diode.

Figure 10B:
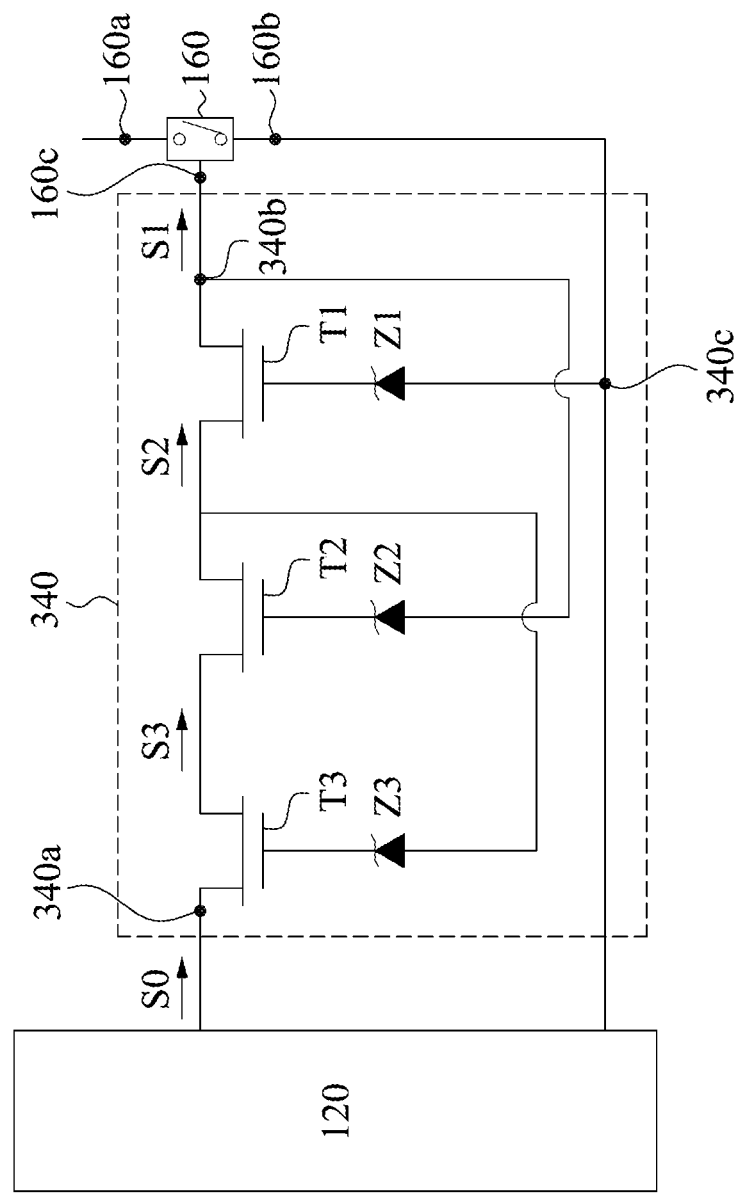
FIG. 10B is a diagram illustrating the conversion circuit according to some other embodiments of the present disclosure.

FIG. 10B is a diagram illustrating the conversion circuit according to some other embodiments of the present disclosure. With respect to the embodiments of FIG. 10B, like elements in FIG. 3 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 10B.

In some embodiments, the voltage control switching circuit 340 includes the first voltage-control switch T1, a second voltage-control switch T2 and a third voltage-control switch T3. The third voltage-control switch T3 receives the original signal S0 and generates the driving signal S3, then outputs the driving signal S3 to the second voltage-control switch T2. Similarly, the second voltage-control switch T2 receives the driving signal S3 and generates the driving signal S2, then outputs the driving signal S2 to the first voltage-control switch T1.

In structural, a second drain terminal of the second voltage-control switch T2 is coupled to the first terminal 340a of the voltage control switching circuit 340. A second source terminal of the second voltage-control switch T2 is coupled to the first drain terminal of the first voltage-control switch T1, and is coupled to the second terminal 340b of the voltage control switching circuit 340 through the first voltage-control switch T1. A second gate terminal of the second voltage-control switch T2 is coupled to the control terminal 160c of the main device 160 (or coupled to the first source terminal of the first voltage-control switch T1).

Compared to the embodiments shown in FIG. 10A, in voltage control switching circuit 340 of FIG. 10B, the second gate terminal of the second voltage-control switch T2 is coupled to the control terminal 160c of the main device 160. Accordingly, the problem that the voltage stress of the first voltage-control switch T1 is too large can be avoided when the voltage control switching circuit 340 includes multiple voltage-control switches T1-T3.

Similarly, the third voltage-control switch T3 is coupled between the signal generator 120 and the second voltage-control switch T2, and the third gate terminal of the third voltage-control switch T3 is coupled to the second source terminal of the second voltage-control switch T2 though a clamping elements Z3.

Figure 11:
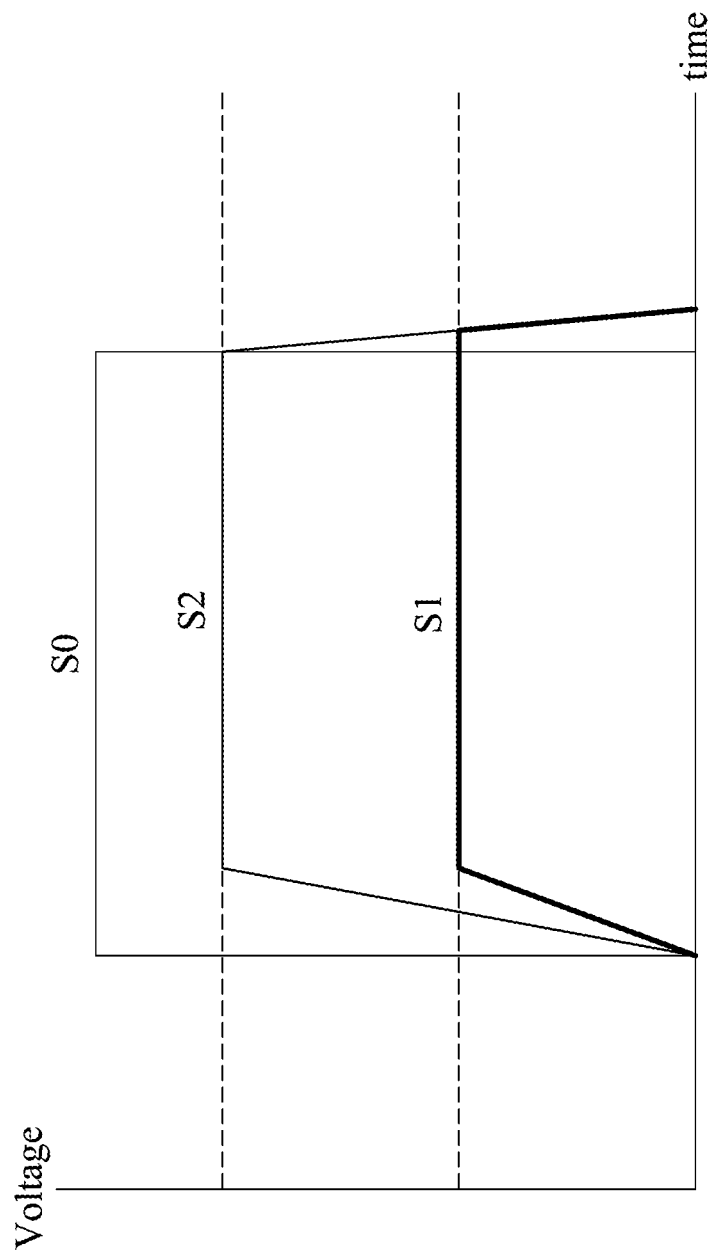
FIG. 11 is a diagram illustrating the voltage change of driving signals of the voltage control switching circuit according to some embodiment of the present disclosure.

FIG. 11 is a diagram illustrating the voltage change of driving signals of the voltage control switching circuit 340 as illustrated in FIG. 10A. As shown in FIG. 11, the voltage level of the original signal S0 is higher than the voltage level of the driving signal S2, and the voltage level of the driving signal S2 is higher than the voltage level of the driving signal S1. Since the conversion circuit 100 reduces the voltage level of the original signal S0 though multiple voltage-control switches T1-T3 sequentially, the main device 160 is prevented from damages resulting from driving signals with voltage level greater than the upper safety limit.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A conversion circuit, comprising:
   a main device, comprising a first terminal, a second terminal and a control terminal; and
   a voltage control switching circuit, comprising:
   a first terminal configured to receive an original signal;
   a second terminal coupled to the control terminal of the main device, and configured to transmit a driving signal to drive the main device;
   a reference terminal coupled to the second terminal of the main device, wherein a voltage level of the driving signal is generated by the voltage control switching circuit;
   a first voltage-control switch comprising:
   a first drain terminal coupled to the first terminal of the voltage control switching circuit;
   a first source terminal coupled to the second terminal of the voltage control switching circuit; and
   a first gate terminal coupled to the reference terminal of the voltage control switching circuit; and
   a clamping circuit comprising:
   a first terminal of the clamping circuit coupled to the first gate terminal of the first voltage-control switch; and
   a second terminal of the clamping circuit coupled to the reference terminal of the voltage control switching circuit, wherein a voltage across the first terminal of the clamping circuit and the second terminal of the clamping circuit is clamped to a predetermined level, wherein the voltage level of the driving signal is generated by the voltage control switching circuit in response to a threshold voltage generated by the first voltage-control switch; and
   a plurality of clamping elements coupled to the first gate terminal of the first voltage-control switch, wherein at least one of the plurality of clamping elements is further coupled to the reference terminal, and the at least one of the plurality of clamping elements is implemented by a Zener diode.

2. The conversion circuit of claim 1, wherein the first voltage-control switch comprises a normally-on device, a normally-off device, or any combination thereof.

3. The conversion circuit of claim 2, wherein the threshold voltage of the normally-on device is between −0.1 volts and −20 volts.

4. The conversion circuit of claim 1, wherein the voltage control switching circuit further comprises:
   a second voltage-control switch comprising:
   a second drain terminal coupled to the first terminal of the voltage control switching circuit;
   a second source terminal coupled to the first drain terminal; and
   a second gate terminal coupled to the reference terminal of the voltage control switching circuit.

5. The conversion circuit of claim 1, wherein the voltage control switching circuit further comprises:
   a second voltage-control switch comprising:
   a second drain terminal coupled to the first terminal of the voltage control switching circuit;
   a second source terminal coupled to the first drain terminal; and
   a second gate terminal coupled to the control terminal of the main device.

6. A conversion circuit, comprising:
   a signal generator configured to receive an input voltage from a voltage source and generate an original signal; and
   a voltage control switching circuit, comprising:
   a first terminal configured to receive the original signal;

a second terminal configured to output a driving signal in response to the original signal;

a reference terminal coupled to the signal generator, wherein a current passing through the voltage control switching circuit is controlled in response to a voltage level of the reference terminal; and a first voltage-control switch comprising:
 a first drain terminal coupled to the first terminal of the voltage control switching circuit;
 a first source terminal coupled to the second terminal of the voltage control switching circuit;
 a first gate terminal coupled to the reference terminal of the voltage control switching circuit;
 wherein a voltage level of the original signal is higher than the voltage level of the driving signal; and a clamping circuit, comprising:
 a first terminal of the clamping circuit coupled to the first gate terminal of the first voltage-control switch; and
 a second terminal of the clamping circuit coupled to the reference terminal of the voltage control switching circuit, wherein a voltage across the first terminal of the clamping circuit and the second terminal of the clamping circuit is clamped to a predetermined level;
 wherein the voltage level of the driving signal is clamped by the voltage control switching circuit in response to a threshold voltage generated by the first voltage-control switch;

wherein the clamping circuit further comprises a plurality of clamping elements, the plurality of clamping elements are coupled to the first gate terminal of the first voltage-control switch, and at least one of the plurality of clamping elements is further coupled to the reference terminal; and wherein the at least one of the plurality of clamping elements is implemented by a Zener diode.

7. The conversion circuit of claim 6, wherein the first voltage-control switch comprises a normally-on device, a normally-off device, or any combination thereof.

8. The conversion circuit of claim 7, wherein the threshold voltage of the normally-on device is between −0.1 volts and −20 volts.

9. The conversion circuit of claim 6, wherein the voltage control switching circuit further comprises:
 a second voltage-control switch comprising:
 a second drain terminal coupled to the first terminal of the voltage control switching circuit;
 a second source terminal coupled to the first drain terminal; and
 a second gate terminal coupled to the reference terminal of the voltage control switching circuit.

10. The conversion circuit of claim 6, wherein the voltage control switching circuit further comprises:
 a second voltage-control switch comprising:
 a second drain terminal coupled to the first terminal of the voltage control switching circuit;
 a second source terminal coupled to the first drain terminal; and
 a second gate terminal coupled to the first source terminal.

* * * * *